United States Patent
Cao et al.

(10) Patent No.: US 9,496,446 B2
(45) Date of Patent: Nov. 15, 2016

(54) PHOTOVOLTAIC DEVICES AND METHOD OF MAKING

(75) Inventors: Jinbo Cao, Rexford, NY (US); Bastiaan Arie Korevaar, Schenectady, NY (US); Dalong Zhong, Niskayuna, NY (US); Juan Carlos Rojo, Niskayuna, NY (US); Qianqian Xin, Shanghai (CN); Aharon Yakimov, Niskayuna, NY (US); Hongying Peng, Clifton Park, NY (US)

(73) Assignee: First Solar, Inc., Tempe, AZ (US)

( * ) Notice: Subject to any disclaimer, the term of this patent is extended or adjusted under 35 U.S.C. 154(b) by 391 days.

(21) Appl. No.: 13/362,813

(22) Filed: Jan. 31, 2012

(65) Prior Publication Data

US 2013/0192667 A1  Aug. 1, 2013

(51) Int. Cl.
*H01L 31/00* (2006.01)
*H01L 31/073* (2012.01)
*H01L 31/0749* (2012.01)

(52) U.S. Cl.
CPC ......... *H01L 31/073* (2013.01); *H01L 31/0749* (2013.01); *Y02E 10/541* (2013.01); *Y02E 10/543* (2013.01); *Y02P 70/521* (2015.11)

(58) Field of Classification Search
CPC .............. H01L 31/073; H01L 31/0749; H01L 31/0352; H01L 31/18; H01L 27/14696; Y02E 10/541; Y02E 10/543
USPC .......................................................... 136/260
See application file for complete search history.

(56) References Cited

U.S. PATENT DOCUMENTS

| | | | | |
|---|---|---|---|---|
| 4,143,235 | A | * | 3/1979 | Duisman ........................ 136/258 |
| 4,362,896 | A | * | 12/1982 | Singh ............................. 136/258 |
| 4,595,791 | A | | 6/1986 | Basol et al. |
| 5,261,968 | A | | 11/1993 | Jordan |
| 5,279,678 | A | | 1/1994 | Jordan et al. |
| 7,939,363 | B1 | * | 5/2011 | Johnson et al. ................ 438/87 |
| 7,943,415 | B1 | | 5/2011 | Gossman et al. |
| 8,044,477 | B1 | | 10/2011 | Zhong et al. |
| 2005/0009228 | A1 | * | 1/2005 | Wu et al. ........................ 438/95 |
| 2009/0194165 | A1 | | 8/2009 | Murphy et al. |
| 2009/0242029 | A1 | | 10/2009 | Paulson et al. |
| 2011/0039366 | A1 | * | 2/2011 | Basol ................... C23C 18/1204 438/62 |
| 2011/0265868 | A1 | | 11/2011 | Drayton et al. |
| 2012/0028407 | A1 | * | 2/2012 | Feldman-Peabody ......... H01L 31/022466 438/94 |

OTHER PUBLICATIONS

Rakhshani et al "Characterization of CdS films prepared by chemical bath deposition", Aug. 2000.*

(Continued)

*Primary Examiner* — Tamir Ayad
*Assistant Examiner* — Uyen Tran
(74) *Attorney, Agent, or Firm* — MacMillan, Sobanski & Todd, LLC

(57) ABSTRACT

A photovoltaic device is presented. The photovoltaic device includes a transparent conductive layer; a window layer disposed on the transparent conductive layer; and an absorber layer disposed on the window layer. The window layer includes a low-diffusivity layer disposed adjacent to the transparent conductive layer and a high-diffusivity layer interposed between the low-diffusivity layer and the absorber layer. Method of making a photovoltaic device is also presented.

20 Claims, 7 Drawing Sheets

(56) References Cited

OTHER PUBLICATIONS

O'brien et al "Developing an understanding of the processes controlling the chemical bath deposition of ZnS and CdS", Aug. 1998.*

Oladeji et al, "Synthesis and processing of CdS/ZnS multlayer films for solar cell application", Aug. 2004.*

Saez-Araoz et al ,"Use of different Zn precursors for the deposition of Zn (S,O) bufferes layers by chemical bath for chalcopyrite based Cd-Free thin film solar cells", 2008.*

Gledhill et al, "A spray pyrolysis route to the undoped ZnO layer of Cu(In,Ga)(S,Se)2 solar cells", 2009.*

Ellmer et al, "Relations between texture and electrical parameters of thin polycrystalline Zinc oxide films", 1996.*

Li et al.,"Structure and Properties of Electrically Deposited Cadmium Sulfide Films", Telecommunications and Radio Engineering, 2008, vol. 67, Issue 9, pp. 843-851.

Albin et al.,"Interactions between Chemical Bath Deposited CdS and Neighbor Layers in CdS/CdTe Solar Cell Devices", Downloaded from the Internet<http://www.electrochem.org/dl/ma/203/pdfs/0565.pdf>, on Jan. 27, 2012, 1 Page.

\* cited by examiner

PHOTOVOLTAIC DEVICES AND METHOD OF MAKING

BACKGROUND

The invention generally relates to photovoltaic devices. More particularly, the invention relates to photovoltaic devices that include a window layer comprising a high-diffusivity layer and a low-diffusivity layer.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells.

During the device fabrication process, the photovoltaic devices (such as, CdTe/CdS cells) are typically exposed to high temperatures, which may result in bulk and grain-boundary inter-diffusion of sulfur or tellurium between the window and absorber layers. Diffusion of sulfur or tellurium between the two layers is desirable as the inter-diffusion results in passivation of defects at the interface and grain boundaries and may also lead to reduction in lattice mismatch, resulting in improved device performance and long-term stability. However, diffusion of sulfur from a thin (<200 nm) window layer to the absorber layer or diffusion of tellurium from the absorber layer to the window layer may be inhomogeneous, resulting in a discontinuous window layer and incomplete interface and grain-boundary passivation. Further, diffusion of tellurium into the window layer may be desirable only at the interface (for example, for better lattice matching) as diffusion of tellurium into the bulk of the window layer may lead to reduction in bandgap or increased absorption in the window layer. A thicker window layer may be desirable for improved sulfur or tellurium diffusion. However, a thicker window layer may lead to low device current density because of greater light absorption in the short wavelength range Thus, improved photovoltaic devices having window layer configurations that allow for enhanced sulfur or tellurium diffusion into the window or absorber layers, while providing the desired current density, may be desirable. Further, there is a need for improved photovoltaic devices including window layer configurations that provide for improved interface between the window and the absorber layers, resulting in improved device performance and long term stability of the devices.

BRIEF DESCRIPTION OF THE INVENTION

Embodiments of the present invention are included to meet these and other needs. One embodiment is a photovoltaic device. The photovoltaic device includes a transparent conductive layer, a window layer disposed on the transparent conductive layer, and an absorber layer disposed on the window layer. The window layer includes a low-diffusivity layer disposed adjacent to the transparent conductive layer and a high-diffusivity layer interposed between the low-diffusivity layer and the absorber layer.

One embodiment is a photovoltaic device. The photovoltaic device includes a transparent conductive layer, a window layer disposed on the transparent conductive layer; and an absorber layer disposed on the window layer. The window layer includes a first high-diffusivity layer disposed adjacent to the transparent conductive layer, a second high-diffusivity layer disposed adjacent to the absorber layer, and a low-diffusivity later interposed between the first and second high-diffusivity layers.

One embodiment is a method. The method includes disposing a window layer on a transparent conductive layer, wherein the window layer includes a low-diffusivity layer and a high-diffusivity layer, and wherein disposing the window layer includes disposing the low-diffusivity layer adjacent to the transparent conductive layer and disposing the high-diffusivity layer on the low-diffusivity layer.

DRAWINGS

These and other features, aspects, and advantages of the present invention will become better understood when the following detailed description is read with reference to the accompanying drawings, wherein.

DETAILED DESCRIPTION

Figure 1:
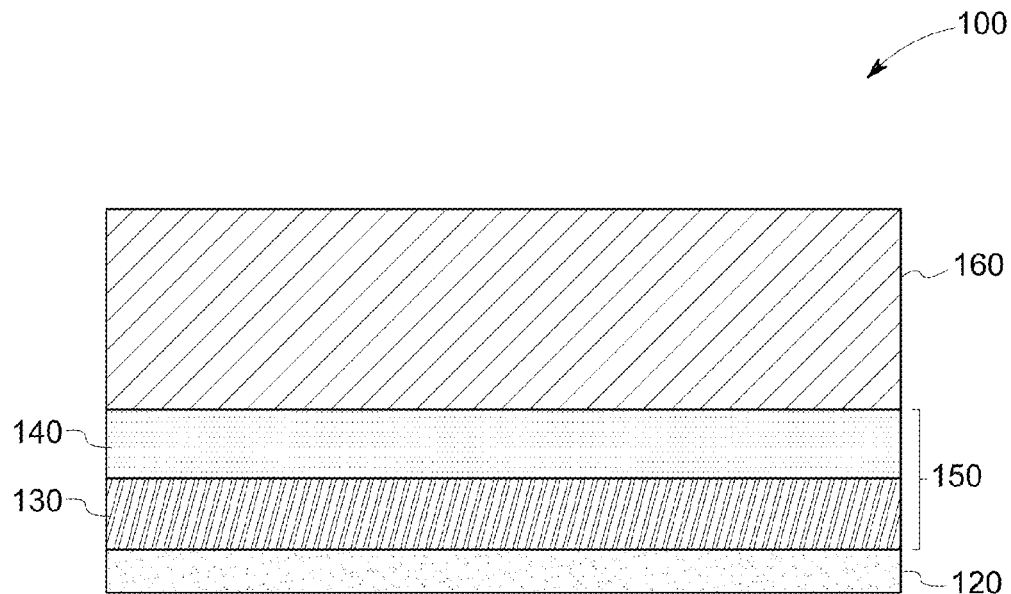
FIG. 1 is a schematic of a photovoltaic device, according to one embodiment of the invention.

As discussed in detail below, some of the embodiments of the invention include photovoltaic devices including a window layer. Further, some of the embodiments of the invention include photovoltaic devices that include a window layer comprising a high-diffusivity layer and a low-diffusivity layer. Without being bound by any theory, it is believed that the high-diffusivity layer may provide for improved diffusion of sulfur or tellurium at the interface between the window layer and the absorber layer, which in some embodiments may lead to more uniform depletion of the high diffusivity layer at the interface. Further, the low-diffusivity layer, being more resistant to depletion, may provide for a continuous thin window layer in the final photovoltaic device. In some embodiments, the window layer configurations of the present invention may advantageously provide for a more uniform lateral depletion of the high-diffusivity layer in the window layer. Furthermore, the window layer configuration, in accordance with some embodiments of the invention, may advantageously allow for diffusion of tellurium from the absorber layer only in the high-diffusivity layer while the low-diffusivity layer may prevent, or at least significantly inhibit, the diffusion of tellurium into the bulk of the window layer.

Furthermore, without being bound by any theory, it is believed that a window layer configuration including a plurality of layers, wherein the layers exhibit different relative rates of sulfur diffusion into the absorber layer or of tellurium diffusion from the absorber layer advantageously provides for improved interface between the window and the absorber layers, resulting in improved device performance and long term stability of the devices. Some embodiments of the invention further include photovoltaic devices having a bi-layered, a multi-layered, or a graded structure.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The terms "transparent region" and "transparent layer" as used herein, refer to a region or a layer that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

Figure 2:
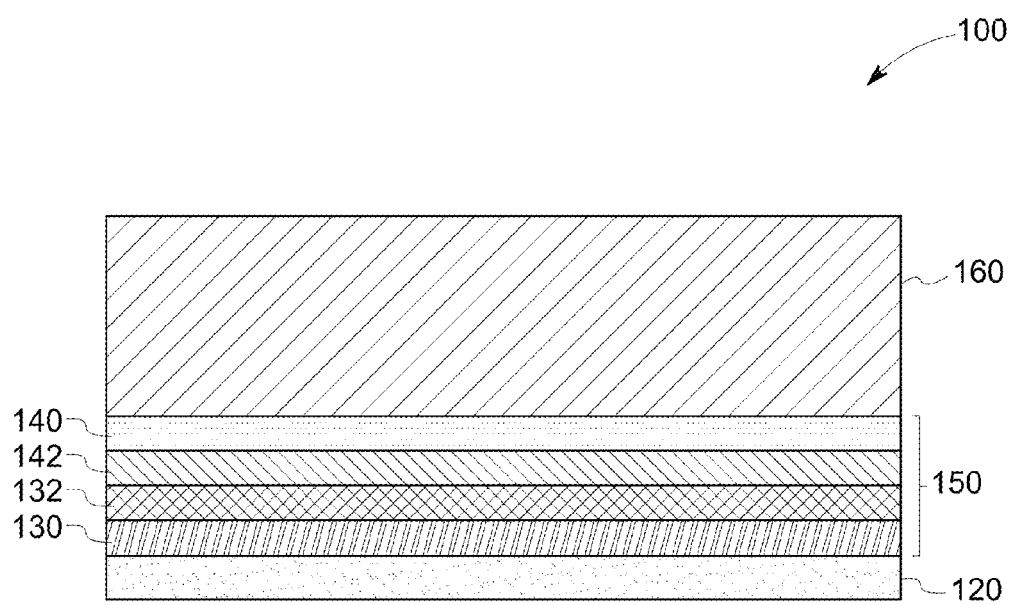
FIG. 2 is a schematic of a photovoltaic device, according to one embodiment of the invention.
Figure 3:
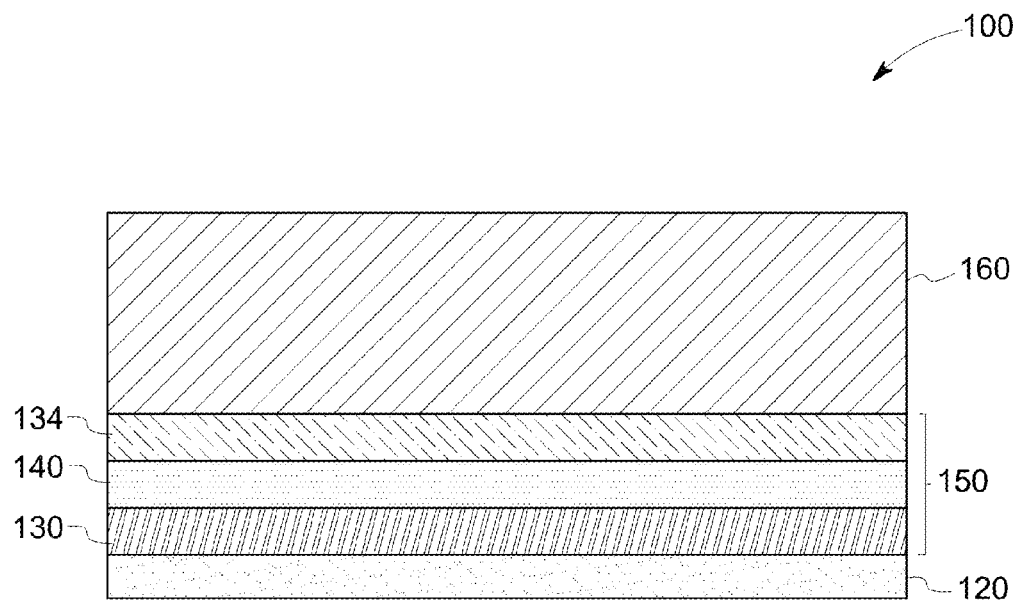
FIG. 3 is a schematic of a photovoltaic device, according to one embodiment of the invention.

As discussed in detail below, some embodiments of the invention are directed to a photovoltaic device including a window layer. A photovoltaic device 100, according to one embodiment of the invention, is illustrated in FIGS. 1-3. As shown in FIGS. 1-3, the photovoltaic device 100 includes a transparent conductive layer 120, a window layer 150 disposed on the transparent conductive 120, and an absorber layer 160 disposed on the window layer 150. The window layer 150 further includes a low-diffusivity layer 130 disposed adjacent to the transparent conductive layer 120 and a high-diffusivity layer 140 interposed between the low-diffusivity layer 130 and the absorber layer 150.

The term "adjacent" as used in this context means that the low diffusivity layer 130 is in direct contact with the transparent conductive layer 120. The term "interposed" as used herein means that the high diffusivity layer 140 is disposed between the low-diffusivity layer 140 and the absorber layer 160 such that the high-diffusivity layer 150 is in direct contact with one or both of the low-diffusivity layer 140 and the absorber layer 160 (for example, as indicated in FIG. 1); or alternately one or more intervening layers are disposed therebetween (for example, as indicated in FIGS. 2 and 3).

The term "window layer" as used herein refers to a semiconducting layer that is substantially transparent and forms a heterojunction with the absorber layer 160. Non-limiting exemplary materials for the window layer 150 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO:H), or combinations thereof. In a certain embodiment, the window layer 150 includes CdS.

The term "absorber layer" as used herein refers to a semiconducting layer wherein the solar radiation is absorbed. In one embodiment, the absorber layer 160 includes a p-type semiconductor material. In one embodiment, the absorber layer 160 has an effective carrier density in a range from about $1 \times 10^{13}$ per cubic centimeter to about $1 \times 10^{16}$ per cubic centimeter. As used herein, the term "effective carrier density" refers to the average concentration of holes and electrons in a material.

In one embodiment, a photoactive material is used for forming the absorber layer 160. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium (Cu(In,Ga,Al)(S,Se)$_2$), copper zinc tin sulfide (CZTS), or combinations thereof. The above-mentioned photo-active semiconductor materials may be used alone or in combination. Further, these materials may be present in more than one layer, each layer having different type of photo-active material or having combinations of the materials in separate layers. In certain embodiments, the absorber layer 160 includes cadmium telluride (CdTe). In certain embodiments, the absorber layer 160 includes p-type cadmium telluride (CdTe).

In some embodiments, the window layer 150 and the absorber layer 160 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

In some embodiments, the window layer 150 includes an n-type semiconductor material. In such embodiments, the absorber layer 160 may be doped to be p-type and the window layer 150 and the absorber layer 160 may form an "n-p" heterojunction. In some embodiments, the window layer 150 may be doped to be n-type and the absorber layer 160 may be doped such that it effectively forms an n-i-p configuration, using a p+-semiconductor layer on the backside of the absorber layer 160.

As noted earlier, the window layer 150 includes a low-diffusivity layer 130 and a high-diffusivity layer 140. The terms "low-diffusivity layer" and "high-diffusivity layer", as used herein, refer to the capability of sulfur diffusion from the window layer 150 to the absorber layer 160 or tellurium diffusion from the absorber layer 160 to the window layer 150, in the two layers relative to each other. The high-diffusivity layer 140 is capable of greater sulfur diffusion from the high-diffusivity layer 140 into the absorber layer 160 or greater tellurium diffusion from the absorber layer 160 into the high-diffusivity layer 140, relative to the low-diffusivity layer 130.

As noted earlier, without being bound by any theory, it is believed that the high-diffusivity layer 140 may provide for improved sulfur or tellurium diffusion at the interface between the window layer 150 and the absorber layer 160, and the low-diffusivity layer 130 may provide for a continuous thin window layer in the final photovoltaic device. Further, the window layer configuration, in accordance with some embodiments of the invention, may advantageously allow for diffusion of tellurium from the absorber layer only in the high-diffusivity layer while the low-diffusivity layer may prevent the diffusion of tellurium into the bulk of the window layer. Furthermore, without being bound by any theory, it is believed that a window layer configuration including layers exhibiting different relative rates of sulfur diffusion into the absorber layer, or of tellurium diffusion into the window layer, allows for improved interface between the window and the absorber layers, resulting in improved device performance and long term stability of the devices.

As noted earlier, the window layer 130 includes a semiconductor material. In some embodiments, the low-diffusivity layer 130 and the high diffusivity layer 140 include substantially the same semiconductor material. The term "substantially the same semiconductor material" means that the semiconductor properties of the two layers are derived from the same semiconductor material. In some embodiments, the low-diffusivity layer 130 and the high diffusivity layer 140 substantially include cadmium sulfide. The term "substantially include cadmium sulfide", as used herein, means that cadmium sulfide makes up at least 90 weight percent of the layer. In some embodiments, one or both of the low-diffusivity layer 130 and the high-diffusivity layer 140 may include further impurities and dopants, such as for example, oxygen, as described later.

In some embodiments, the low-diffusivity layer 130 and the high-diffusivity layer 140 may be further characterized by one or more of grain size, oxygen concentration, void fraction (porosity), density, or cadmium sulfate content in the two layers. In some embodiments, the relative diffusion of sulfur from the two layers 130/140 or the relative diffusion of tellurium into the two layers 130/140 may be altered by varying one or more of grain size, oxygen concentration, void fraction, density, and cadmium sulfate content in the two layers. In some embodiments, the high-diffusivity layer 140 includes one or more of a smaller median grain size, greater oxygen concentration, greater voids fraction, lower effective density, or greater cadmium sulfate concentration than the low-diffusivity layer.

In some embodiments, the low-diffusivity layer 130 and the high-diffusivity layer 140 may be characterized by the median grain size in the two layers. In some embodiments, the window layer 150 includes a plurality of grains, and a median grain size in the low-diffusivity layer 130 is greater than a median grain size in the high-diffusivity layer 140. In some embodiments, a ratio of median grain size in the low-diffusivity layer 130 to the median grain size in the high-diffusivity layer 140 is in a range greater than about 2. In some embodiments, a ratio of median grain size in the low-diffusivity layer 130 to the median grain size in the high-diffusivity layer 140 is in a range greater than about 10. In some embodiments, a ratio of median grain size in the low-diffusivity layer 130 to the median grain size in the high-diffusivity layer 140 is in a range greater than about 100. Without being bound by any theory, it is believed that a smaller grain size in the high-diffusivity layer 140 relative to the low-diffusivity layer 130 may allow for higher sulfur diffusion from the high-diffusivity layer 140 into the absorber layer 160 relative to the low-diffusivity layer 130; or higher tellurium diffusion from the absorber layer 160 into the high-diffusivity layer 140 relative to the low-diffusivity layer.

In some embodiments, the median grain size in the low-diffusivity layer 130 is in a range from about 20 nanometers to about 200 nanometers. In some embodiments, the median grain size in the low-diffusivity layer 130 is in a range from about 20 nanometers to about 100 nanometers. In certain embodiments, the median grain size in the low-diffusivity layer 130 is in a range from about 20 nanometers to about 80 nanometers.

In some embodiments, the median grain size in the high-diffusivity layer 140 is in a range less than about 20 nanometers. In some embodiments, the median grain size in the high-diffusivity layer 140 is in a range less than about 10 nanometers. In certain embodiments, the median grain size in the high-diffusivity layer 140 is in a range less than about 1 nanometer. In some embodiments, the high-diffusivity layer 140 may be substantially amorphous. The term "substantially amorphous" as used herein means that the high-diffusivity layer does not have a crystalline pattern as observed by X-ray diffraction (XRD).

In some embodiments, the median grain size in the low-diffusivity layer 130 or the high-diffusivity layer 140 is substantially constant across the thickness of the layer. The term "substantially constant" as used in this context means that a change in grain size is less than 5 percent across the thickness of the low-diffusivity layer 130 or the high-diffusivity layer 140. In some embodiments, the window layer 150 includes a step-change in median grain size at the interface 133 between the low-diffusivity layer 130 and the high-diffusivity layer 140.

In alternate embodiments, the median grain size in the low-diffusivity layer 130 or the high-diffusivity layer 140 is graded across the thickness of the layer. In some embodiments, the window layer 150 includes a gradient in grain size across the thickness of the window layer 150 such that the median grain size in the window layer 150 continuously decreases in a direction away from the transparent conductive layer 120 and towards the absorber layer 160.

In some embodiments, the low-diffusivity layer 130 and the high-diffusivity layer 140 may be characterized by the oxygen content in the two layers. In some embodiments, the window layer 150 further includes oxygen and a concentration of oxygen in the high-diffusivity layer 140 is greater than a concentration of oxygen in the low-diffusivity layer 130. The term "concentration" as used herein refers to the molar concentration or the moles of oxygen per unit volume in the low-diffusivity layer 130 or the high-diffusivity layer 140. Further, it should be noted that the term "concentration" refers to an average number of moles per unit volume in the low-diffusivity layer 130 or the high-diffusivity layer 140.

In some embodiments, a ratio of oxygen concentration in the high-diffusivity layer 140 to the oxygen concentration in the low-diffusivity layer 130 is in a range greater than about 2. In some embodiments, a ratio of oxygen concentration in the high-diffusivity layer 140 to the oxygen concentration in the low-diffusivity layer 130 is in a range greater than about 10. Without being bound by any theory, it is believed that a higher oxygen concentration in the high-diffusivity layer 140 relative to the low-diffusivity layer 130 allows may allow for higher sulfur diffusion from the high-diffusivity layer 140 into the absorber layer 160 relative to the low-diffusivity layer 130; or higher tellurium diffusion from the absorber layer 160 into the high-diffusivity layer 140 relative to the low-diffusivity layer.

In some embodiments, the concentration of oxygen in the high-diffusivity layer 140 is in a range from about 4 molar percent to about 25 molar percent. In certain embodiments, the concentration of oxygen in the high-diffusivity layer 140 is in a range from about 10 molar percent to about 20 molar percent.

In some embodiments, the concentration of oxygen in the low-diffusivity layer 130 is in a range up to about 4 molar percent. In some embodiments, the concentration of oxygen in the low-diffusivity layer 130 is in a range from about 0.001 molar percent to about 1 molar percent. In certain embodiments, the low-diffusivity layer 130 is substantially free of oxygen. The term "substantially free" as used in this context means that the concentration of oxygen in the low-diffusivity layer 130 is in a range less than about 0.001 molar percent. Further, the term "substantially free" encompasses completely free.

In some embodiments, the oxygen concentration in the low-diffusivity layer 130 or the high-diffusivity layer 140 is substantially constant across the thickness of the layer. The term "substantially constant" as used in this context means that a change in oxygen concentration is less than 5 percent across the thickness of the low-diffusivity layer 130 or the high-diffusivity layer 140. In some embodiments, the window layer 150 includes a step-change in oxygen concentration at the interface 133 between the low-diffusivity layer 130 and the high-diffusivity layer 140.

In alternate embodiments, the oxygen concentration in the low-diffusivity layer 130 or the high-diffusivity layer 140 is graded across the thickness of the layer. In some embodiments, the window layer 150 includes a gradient in oxygen concentration across the thickness of the window layer 150 such that the oxygen concentration in the window layer 150 continuously decreases in a direction away from the transparent conductive layer 120 and towards the absorber layer 160.

In some embodiments, the low-diffusivity layer 130 and the high-diffusivity layer 140 may be characterized by both the oxygen content and the median grain size in the two layers. In certain embodiments, the low-diffusivity layer 130 is characterized by both a larger grain size and a lower oxygen concentration than the high-diffusivity layer 140.

In some embodiments, the oxygen content in the window layer 150 may be present, at least in part, in the form of cadmium sulfate. In some embodiments, a concentration of cadmium sulfate in the high-diffusivity layer 140 is greater than a concentration of cadmium sulfate in the low-diffusivity layer 130. In some embodiments, a ratio of cadmium sulfate concentration in the high-diffusivity layer 140 to the oxygen concentration in the low-diffusivity layer 130 is in a range greater than about 2. In some embodiments, the low-diffusivity layer 130 is substantially free of cadmium sulfate. The term "substantially free" as used in this context means that the concentration of cadmium sulfate in the low-diffusivity layer 130 is in a range less than about 0.001 molar percent.

In some embodiments, the low-diffusivity layer 130 or the high-diffusivity layer 140 may be characterized by the void fraction in the two layers. In some embodiments, the window layer 150 includes a plurality of voids and a void fraction in the high-diffusivity layer 140 is greater than a void fraction in the low-diffusivity layer 130. The term "void fraction" as used herein refers to the ratio of volume occupied by the voids to the total volume of the window layer material. In some embodiments, a ratio of void fraction in the high-diffusivity layer 140 to the void fraction low-diffusivity layer 130 is greater than about 2. In certain embodiments, the low-diffusivity layer 130 is substantially free of voids. The term "substantially free" as used in this context means that the voids fraction in the low-diffusivity layer 130 is less than about 0.01.

In some embodiments, the low-diffusivity layer 130 or the high-diffusivity layer 140 may be characterized by the effective density of the two layers. The term "effective density" as used herein refers to the average density of the layer. In some embodiments, an effective density of the low-diffusivity layer 130 is greater than an effective density of the high-diffusivity layer 140. In some embodiments, a ratio of effective density in the low-diffusivity layer 130 to the high-diffusivity layer 140 is in a range greater than about 1.2.

The low-diffusivity layer 130 or the high-diffusivity layer 140 may be characterized by thickness. In some embodiments, the low-diffusivity layer 130 has a thickness in a range from about 20 nanometers to about 80 nanometers. In some embodiments, the high-diffusivity layer 140 has a thickness in a range from about 20 nanometers to about 80 nanometers.

Figure 4:
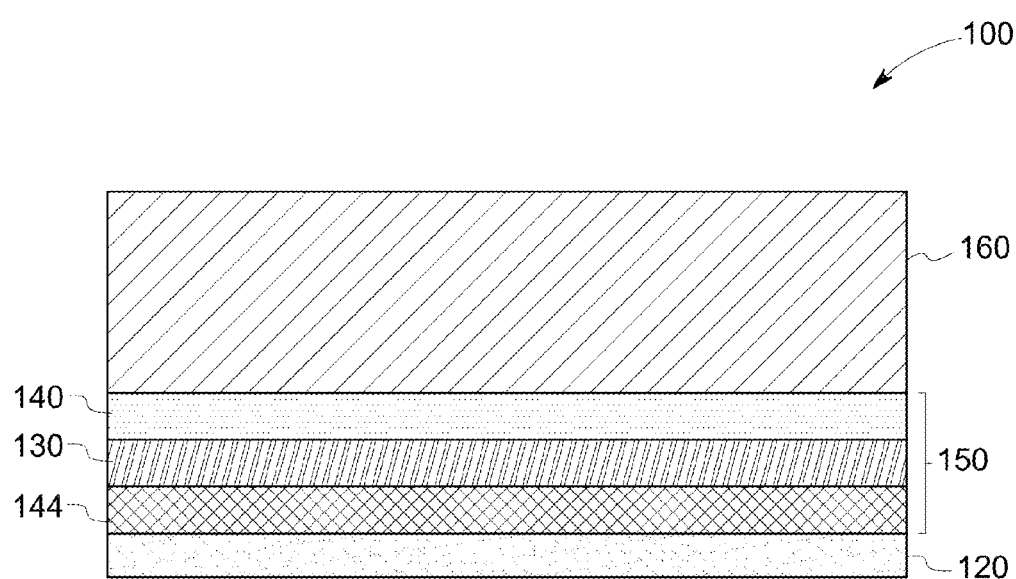
FIG. 4 is a schematic of a photovoltaic device, according to one embodiment of the invention.

As noted earlier, the high-diffusivity layer 140 is interposed between the low-diffusivity layer 140 and the absorber layer 160 such that the high-diffusivity layer 150 is in direct contact with one or both of the low-diffusivity layer 140 and the absorber layer 160 (for example, as indicated in FIG. 1); or alternately one or more intervening layers are disposed therebetween (for example, as indicated in FIGS. 2-4).

In some embodiments, the high-diffusivity layer 140 is disposed adjacent to the low-diffusivity layer 140 and the absorber layer 160, as indicated in FIG. 1. In such embodiments, the window layer 150 includes a bi-layer structure.

In some embodiments, the high-diffusivity layer 140 is disposed adjacent to the absorber layer 160, and a plurality of layers 132, 142 is interposed between the low-diffusivity layer 130 and the high-diffusivity layer 140, as indicated in FIG. 2. FIG. 2 illustrates an exemplary embodiment only wherein two layers are interposed between the low-diffusivity layer 130 and the high-diffusivity layer 140. However, the embodiments described herein also encompass those having more than two intervening layers.

In some embodiments, the sulfur or tellurium diffusion capability in the plurality of layers 132, 142 increases in a direction away from the low-diffusivity layer 130 and towards the high-diffusivity layer 140. In certain embodiments, a gradient in sulfur or tellurium diffusion capability is present across the plurality of layers 132, 142, such that the sulfur or tellurium diffusion capability increases in a direction away from the low-diffusivity layer 130 and towards the high-diffusivity layer 140.

In some embodiments, one or more of oxygen concentration, cadmium sulfate concentration, or void fraction in the plurality of layers 132, 142 increases in a direction away from the low-diffusivity layer 130 and towards the high-diffusivity layer 140. Thus, by way of example, in some embodiments, the layer 132 may have oxygen concentration greater than the low-diffusivity layer 130 and lower than the layer 142. Similarly, the layer 142 may have oxygen concentration greater than the layer 132 and lower than the high-diffusivity layer 140. In certain embodiments, a gradient in one or more of oxygen concentration, cadmium sulfate concentration, or void fraction is present across the plurality of layers 132, 142, such that one or more of oxygen concentration, cadmium sulfate concentration, or void fraction increases in a direction away from the low-diffusivity layer 130 and towards the high-diffusivity layer 140.

In some embodiments, one or both of median grain size and effective density in the plurality of layers 132, 142 decreases in a direction away from the low-diffusivity layer 130 and towards the high-diffusivity layer 140. Thus, by way of example, in some embodiments, the layer 132 may have median grain size lower than the low-diffusivity layer 130 and greater than the layer 142. Similarly, the layer 142 may have median grain size lower than the layer 132 and greater than the high-diffusivity layer 140. In certain embodiments, a gradient in one or both of median grain size and effective density is present across the plurality of layers 132, 142, such that one or both of median grain size and effective density decreases in a direction away from the low-diffusivity layer 130 and towards the high-diffusivity layer 140.

FIGS. 1 and 2 illustrate embodiments including a low-diffusivity layer/high-diffusivity layer structure. In some other embodiments, the window layer 150 may include a low-diffusivity layer/high-diffusivity layer/low-diffusivity layer structure. Referring now to FIG. 3, in some embodiments, the window layer 150 includes a first low-diffusivity layer 130 disposed adjacent to the transparent conductive layer 120, a second low-diffusivity layer 134 disposed adjacent to the absorber layer 160, and the high-diffusivity layer 140 is interposed between the first low-diffusivity layer 130 and the second low-diffusivity layer 134, as indicated in FIG. 3.

In some embodiments, the window layer 150 may alternately include a high-diffusivity layer/low-diffusivity layer/high-diffusivity layer structure. Referring now to FIG. 4, in some embodiments, the window layer 150 includes a first high-diffusivity layer 144 disposed adjacent to the transparent conductive layer 120, a second high-diffusivity layer 140 disposed adjacent to the absorber layer 160, and the low-diffusivity layer 130 is interposed between the first high-diffusivity layer 144 and the second high diffusivity layer 140, as indicated in FIG. 4.

Figure 5:
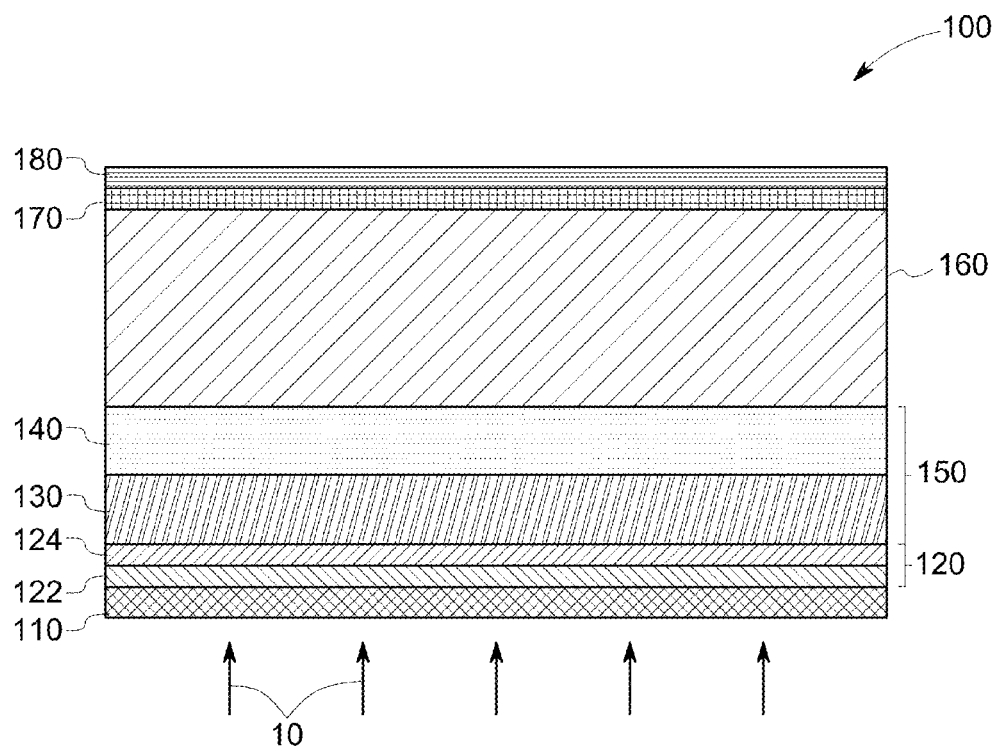
FIG. 5 is a schematic of a photovoltaic device, according to one embodiment of the invention.

As noted earlier, the window layer 150 is a component of a photovoltaic device 100. In some embodiments, the photovoltaic device includes a "superstrate" configuration of layers. In such embodiments, the photovoltaic device 100 further includes a support 110 and the transparent conductive layer 120 is disposed on the support 110, as indicated in FIG. 5. As illustrated in FIG. 5, in such embodiments, the solar radiation 10 enters from the support 110, and after passing through the transparent conductive layer 120 and the window layer 150, enters the absorber layer 160, where the conversion of electromagnetic energy of incident light (for instance, sunlight) to electron-hole pairs (that is, to free electrical charge) occurs.

In some embodiments, the support 110 is transparent over the range of wavelengths for which transmission through the support 110 is desired. In one embodiment, the support 110 may be transparent to visible light having a wavelength in a range from about 400 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent conductive layer 120 and the support 110, such as, for example, an anti-reflective layer or a bather layer (not shown).

In some embodiments the transparent conductive layer 120 includes an electrically conductive layer (sometimes referred to in the art as a front contact layer) 122 disposed on the support 110, as indicated in FIG. 5. In some embodiments, the window layer 130 is disposed directly on the electrically conductive layer 122 (not shown). In alternate embodiments, the transparent conductive layer 120 includes an electrically conductive layer 122 disposed on the support 110 and an additional buffer layer 124 is interposed between the electrically conductive layer 122 and the window layer 130, as indicated in FIG. 5. In one embodiment, the transparent conductive layer 120 has a thickness in a range from about 100 nanometers to about 600 nanometers.

In some embodiments, the electrically conductive layer 122 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the electrically conductive layer 122 may be in a range of from about 50 nm to about 600 nm, in one embodiment.

In some embodiments, the photovoltaic device 100 further includes a buffer layer (optional), also called a higher resistance transparent (HRT) layer 124, interposed between the window layer 130 and the electrically conductive layer 122, as indicated in FIG. 5. In one embodiment, the thickness of the buffer layer 124 is in a range from about 50 nm to about 200 nm. Non-limiting examples of suitable materials for the buffer layer 124 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), or combinations thereof.

In some embodiments, the photovoltaic device 100 may further include a p+-type semiconductor layer 170 disposed on the absorber layer 160, as indicated in FIG. 5. The term "p+-type semiconductor layer" as used herein refers to a semiconductor layer having an excess mobile p-type carrier or hole density compared to the p-type charge carrier or hole density in the absorber layer 160. In some embodiments, the p+-type semiconductor layer has a p-type carrier density in a range greater than about $1 \times 10^{16}$ per cubic centimeter. The p+-type semiconductor layer 170 may be used as an interface between the absorber layer 160 and the back contact layer 180, in some embodiments.

In one embodiment, the p+-type semiconductor layer 170 includes a heavily doped p-type material including amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, $LaCuOSe_{0.6}Te_{0.4}$, BiCuOSe, BiCaCuOSe, PrCuOSe, NdCuOS, $Sr_2Cu_2ZnO_2S_2$, $Sr_2CuGaO_3S$, $(Zn,Co,Ni)O_x$, or combinations thereof. In another embodiment, the p+-type semiconductor layer 170 includes a heavily doped p+-doped material including zinc telluride, magnesium telluride, manganese telluride, beryllium telluride, mercury telluride, arsenic telluride, antimony telluride, copper telluride, or combinations thereof. In some embodiments, the p+-doped material further includes a dopant including copper, gold, nitrogen, phosphorus, antimony, arsenic, silver, bismuth, sulfur, sodium, or combinations thereof.

In some embodiments, the photovoltaic device 100 further includes a back contact layer 180, as indicated in FIG. 5. In some embodiments, the back contact layer 180 is disposed directly on the absorber layer 160 (not shown). In some other embodiments, the back contact layer 180 is disposed on the p+-type semiconductor layer 170 disposed on the absorber layer 160, as indicated in FIG. 5. In one embodiment, the back contact layer 180 includes gold, platinum, molybdenum, tungsten, tantalum, palladium, aluminum, chromium, nickel, or silver. In certain embodiments, another metal layer (not shown), for example, aluminum, may be disposed on the metal layer 180 to provide lateral conduction to the outside circuit.

Figure 6:
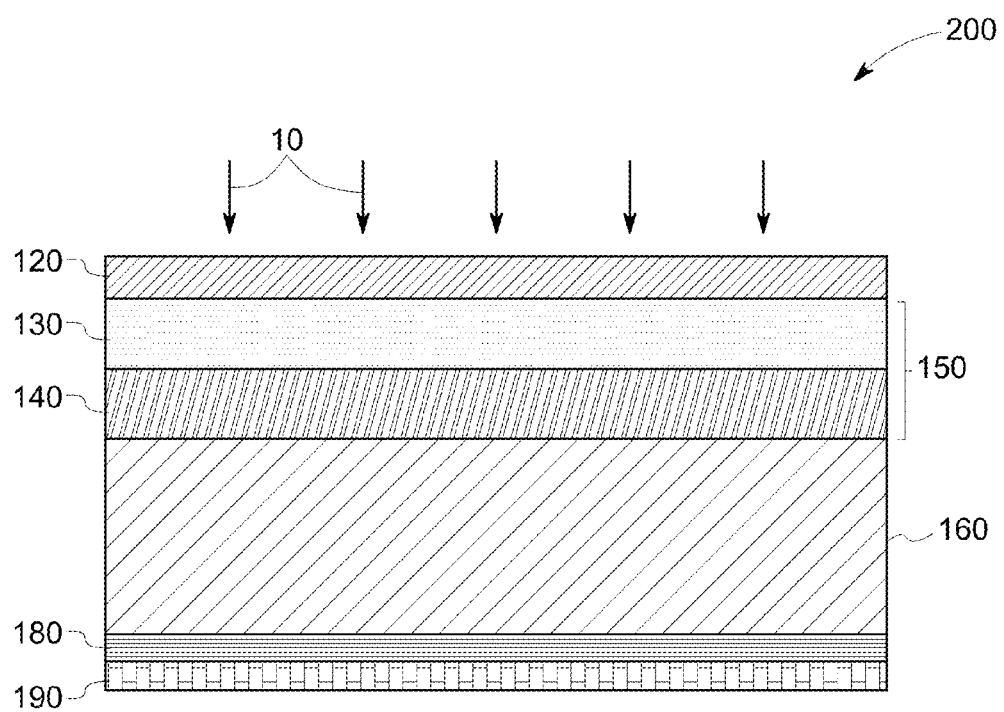
FIG. 6 is a schematic of a photovoltaic device, according to one embodiment of the invention.

In alternative embodiments, as illustrated in FIG. 6, a photovoltaic device 200 including a "substrate" configuration is presented. The photovoltaic device 200 includes a back contact layer 180 disposed on a support 190. Further, the absorber layer 160 is disposed on the back contact layer and the window layer 150 as described herein earlier is disposed on the absorber layer. The transparent conductive layer 120 is further disposed on the window layer 150, as indicated in FIG. 6. As illustrated in FIG. 6, in such embodiments, the solar radiation 10 enters from the transparent conductive layer 120 and after passing through the window layer 150, enters the absorber layer 160, where the conversion of electromagnetic energy of incident light (for instance, sunlight) to electron-hole pairs (that is, to free electrical charge) occurs.

In some embodiments, the composition of the layers illustrated in FIG. 6, such as, the substrate 110, the transparent conductive layer 120, the window layer 150, the absorber layer 160, and the back contact layer 160 may have the same composition as described above in FIG. 5 for the superstrate configuration. In certain embodiments, the absorber layer 160 in the substrate configuration may include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium disulfide (CIS), copper indium diselenide (CISe), copper indium gallium sulfide (CIGS), copper indium gallium diselenide (CIGSe), copper indium gallium sulfur selenium (CIGSSe), copper indium gallium aluminum sulfur selenium $(Cu(In, Ga,Al)(S,Se)_2)$, copper zinc tin sulfide (CZTS), or combinations thereof.

Some embodiments include a method of making a photovoltaic device. Referring to FIGS. 1-5, in some embodiments, the method includes disposing a window layer 150 on a transparent conductive layer 120. Non-limiting examples of the deposition methods for the window layer 150 include one or more of close-space sublimation (CSS), vapor transport deposition (VTD), sputtering (for example, direct current pulse sputtering (DCP), electro-chemical deposition (ECD), and chemical bath deposition (CBD). In some embodiments, the method may further include disposing a transparent conductive layer 120 including an electrically conductive layer 122 on a support 110 by any suitable technique, such as sputtering, chemical vapor deposition, spin coating, spray coating, or dip coating. Referring to FIG. 5, in some embodiments, an optional buffer layer 124 may be deposited on the electrically conductive layer 122 using sputtering to form the transparent conductive layer 120.

As noted earlier, the window layer 150 includes a low-diffusivity layer and 130 a high-diffusivity layer 140. In some embodiments, the method of disposing the window layer 150 includes disposing the low-diffusivity layer 130 adjacent to the transparent conductive layer 120 and disposing the high-diffusivity layer 140 on the low-diffusivity layer 130. In some embodiments, one or both of the low-diffusivity layer 130 and the high-diffusivity layer 140 is disposed by a method including direct current pulse sputtering, chemical bath deposition, or combinations thereof.

In some embodiments, as noted earlier, the method includes disposing a low-diffusivity layer 140 adjacent to the transparent conductive layer 120. In embodiments wherein the transparent conductive layer 120 further includes a buffer layer 124, the method includes disposing the low-diffusivity 130 layer adjacent to the buffer layer 124, as indicated in FIG. 5.

In some embodiments, wherein the window layer 150 includes a bi-layered structure, the method further includes disposing the high-diffusivity layer 140 adjacent to the low-diffusivity layer 130, as indicated in FIG. 1. In alternate embodiments, wherein the window layer 150 includes a multi-layered structure, the method includes disposing the low-diffusivity layer 130 adjacent to the transparent conductive layer 120, disposing the plurality of layers 132, 142 on the low-diffusivity layer sequentially and further disposing the high-diffusivity layer 140 on the layer 142, as indicated in FIG. 2.

In some embodiments, wherein the window layer 150 includes a low-diffusivity layer/high-diffusivity layer/low-diffusivity layer structure, the method includes disposing a first low-diffusivity layer 130 adjacent to the transparent conductive layer 120, disposing a high-diffusivity layer 140 adjacent to the first low-diffusivity layer 130 and disposing a second low-diffusivity layer 134 adjacent to the high-diffusivity layer 140, as indicated in FIG. 3.

In some embodiments, wherein the window layer 150 includes a high-diffusivity layer/low-diffusivity layer/high-diffusivity layer structure, the method includes disposing a first high-diffusivity layer 144 adjacent to the transparent conductive layer 120, disposing a low-diffusivity layer 130 adjacent to the first high-diffusivity layer 130 and disposing a second high-diffusivity layer 140 adjacent to the low-diffusivity layer 140, as indicated in FIG. 4.

In some embodiments, sulfur diffusion or tellurium diffusion in the low-diffusivity layer 130 or the high-diffusivity layer 140 may be altered by controlling one or more of the substrate temperature, annealing treatment, oxygen content in the layer, or post-deposition treatment. In some embodiments, one or more of median grain size, oxygen concentration, void fraction, effective density, or cadmium sulfate concentration in the low-diffusivity layer 130 or the high-diffusivity layer 140 may be altered by controlling one or more of the substrate temperature, annealing treatment, oxygen content in the layer, or post-deposition treatment.

In some embodiments, the low-diffusivity layer 130 and the high-diffusivity layer 140 are disposed under conditions such that the low-diffusivity layer 130 includes one or more of greater median grain size, lower oxygen concentration, lower voids fraction, greater effective density, or lower cadmium sulfate concentration than the high-diffusivity layer 140.

In some embodiments, the low-diffusivity layer 130 may be disposed on the transparent conductive layer 120 by depositing the layer at substrate temperature greater than the substrate temperature used to deposit the high-diffusivity layer 140. In some embodiments, the low-diffusivity layer 130 may be disposed on the transparent conductive layer 120 by depositing the layer at a substrate temperature greater than about 200 degrees Celsius. In some embodiments, the low-diffusivity layer 130 may be disposed on the transparent conductive layer 120 by depositing the layer at a substrate temperature in a range from about 200 degrees Celsius to about 500 degrees Celsius.

In some embodiments, the low-diffusivity layer 130 may be disposed on a transparent conductive layer 120 by subjecting an as-deposited layer to an annealing treatment and wherein the deposition of high-diffusivity layer 140 does not include the annealing treatment. The term "as-deposited layer" as used herein refers to a window layer material that has not been subjected to post-deposition processing, such as, for example, an annealing treatment. In some embodiments, the annealing treatment includes contacting at least a portion of the as-deposited layer with a passivating composition at a suitable processing temperature, such as, for example, a cadmium chloride solution at a temperature in a range from about 500 degrees Celsius to about 700 degrees Celsius.

In some embodiments, the low-diffusivity layer 130 may be disposed on the transparent conductive layer 120 by annealing the as-deposited layer at a temperature in a range from about 500 degrees Celsius to about 700 degrees Celsius in a nitrogen ($N_2$) atmosphere. Without being bound by any theory, it is believed that the higher substrate growth temperature or the post-deposition annealing treatment may result in larger grain size, lower porosity, or films substantially free of oxygen, which may lead to one or more of lower relative sulfur diffusion capability from the low-diffusivity layer 130, lower relative tellurium diffusion capability into the low-diffusivity layer 130, or higher relative resistance to depletion of the low-diffusivity layer 130, with respect to the high-diffusivity layer.

In some embodiments, the low-diffusivity layer 130 or the high-diffusivity layer 140 may be disposed by varying the oxygen content of the target(s) used to deposit the layer, the oxygen content in the atmosphere used for deposition of the layers, or combinations thereof. Thus, by way of example, in some embodiments, a low-diffusivity layer 130 may be disposed by maintaining the oxygen content of the deposition atmosphere lower than the oxygen content of the atmosphere used for depositing the high-diffusivity layer 140, such that the as-deposited high-diffusivity layer 140 includes a higher oxygen concentration than the low-diffusivity layer 130. Without being bound by any theory, it is believed that the higher oxygen content may result in one or more of greater relative sulfur diffusion capability from the high-diffusivity layer 140, greater relative tellurium diffusion capability into the high-diffusivity layer 140, or greater relative tendency toward depletion of the high-diffusivity layer 140, with respect to the low-diffusivity layer.

In some embodiments, the low-diffusivity layer 130 may be disposed on the transparent conductive layer 120 by subjecting the as-deposited layer to post-deposition treatment, such as, for example, treatment with a passivating compound such as cadmium chloride ($CdCl_2$). In some embodiments, the high-diffusivity layer 140 may not be subjected to the post-deposition treatment. Without being bound by any theory, it is believed that the post-deposition treatment with species such as $CdCl_2$ may result in larger grain size, lower porosity, or films substantially free of oxygen, which may lead to one or more of lower relative sulfur diffusion from the low-diffusivity layer 130, lower relative tellurium diffusion into the low-diffusivity layer 130, or greater relative tendency towards resistance to depletion of the low-diffusivity layer 130, with respect to the high-diffusivity layer.

In some embodiments, the method of disposing the low-diffusivity layer 130 or the high-diffusivity layer 140 may include a combination of two or more of the above-mentioned techniques. Thus, by way of example, in some embodiments, a low-diffusivity layer 130 may be deposited by depositing the layer in an atmosphere substantially free of oxygen and further subjecting the as-deposited layer to post-deposition treatment, such as a $CdCl_2$ treatment. After the step of disposing the low-diffusivity layer 130, a high-diffusivity layer 140 may be further disposed by depositing the layer in an atmosphere including oxygen and not subjecting the deposited layer to the step of post-deposition treatment. In embodiments further including a gradient in sulfur diffusion or tellurium diffusion across the thickness of the window layer 150, a plurality of intervening layers 132 and 142 may be deposited using one or more the aforementioned techniques.

As noted earlier, the high-diffusivity layer 140 may be characterized by one or more of a smaller median grain size, greater oxygen concentration, greater voids fraction, lower effective density, or greater cadmium sulfate concentration relative to the low-diffusivity layer 130. In some embodiments, the low-diffusivity layer 130 has a median grain size greater than that that of the high-diffusivity layer 140, in an as-deposited state or after being subjected to an annealing treatment. In some embodiments, a median grain size in the low-diffusivity layer 130 is in a range from about 20 nanometers to about 200 nanometers. In some embodiments, the low-diffusivity layer 130 has an as deposited oxygen concentration in a range upto about 4 molar percent. In some embodiments, an as-deposited low-diffusivity layer is substantially free of oxygen. In some embodiments, the high-diffusivity layer is substantially amorphous in an as-deposited state. In some embodiments, the high-diffusivity layer 140 has an as-deposited oxygen concentration in range from about 4 molar percent to about 25 molar percent.

In some embodiments, the method further includes disposing an absorber layer 160 on the window layer 150. In one embodiment, the absorber layer 160 may be deposited using a suitable method, such as, close-space sublimation (CSS), vapor transport deposition (VTD), ion-assisted physical vapor deposition (IAPVD), radio frequency or pulsed magnetron sputtering (RFS or PMS), plasma enhanced chemical vapor deposition (PECVD), or electrochemical deposition (ECD).

Referring to FIG. 5, a p+-type semiconducting layer 170 may be further disposed on the absorber layer 160 by depositing a p+-type material using any suitable technique, for example PECVD, in one embodiment. In an alternate embodiment, a p+-type semiconductor layer 170 may be disposed on the absorber layer 160 by chemically treating the absorber layer 160 to increase the carrier density on the back-side (side in contact with the metal layer and opposite to the window layer) of the absorber layer 160. In one embodiment, the photovoltaic device 100 may be completed by depositing a back contact layer, for example, a metal layer 180 on the p+-type semiconductor layer 170.

One or more of the window layer 150, the absorber layer 160, the back contact layer 180, or the p+type layer layer 170 (optional) may be may be further heated or subsequently treated (for example, annealed) after deposition to manufacture the photovoltaic device 100.

In some embodiments, other components (not shown) may be included in the exemplary photovoltaic device 100, such as, buss bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

EXAMPLES

Example 1

Varying Sulfur-Diffusivity by Varying Oxygen Concentration

Figure 7:
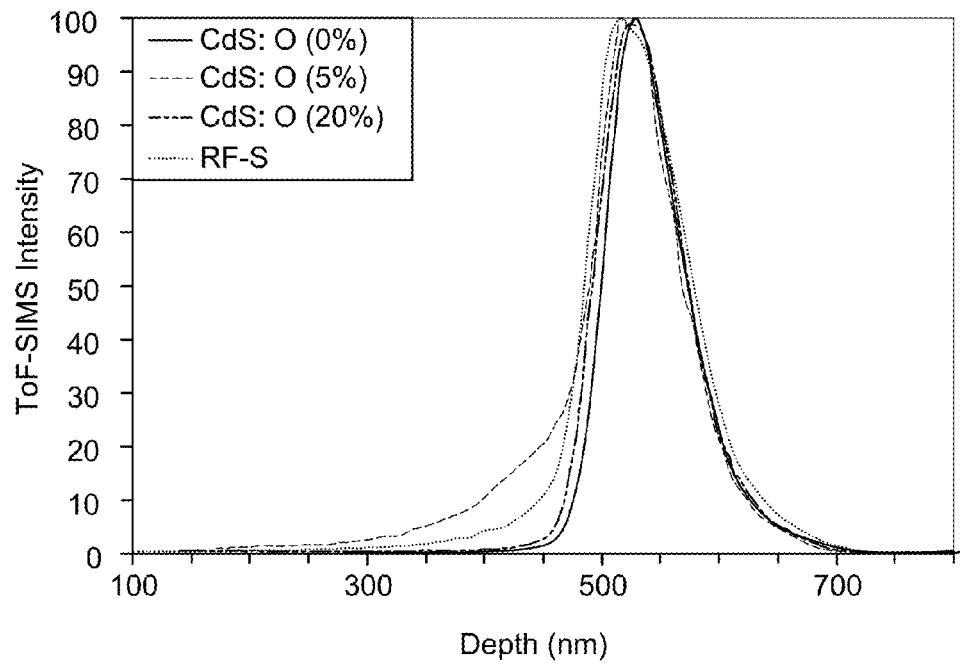
FIG. 7 is a plot of Time-of-Flight Secondary Mass Ion Spectrometry (TOF-SIMS) intensity values as a function of film depth with varying $O_2$ concentration.
Figure 8:
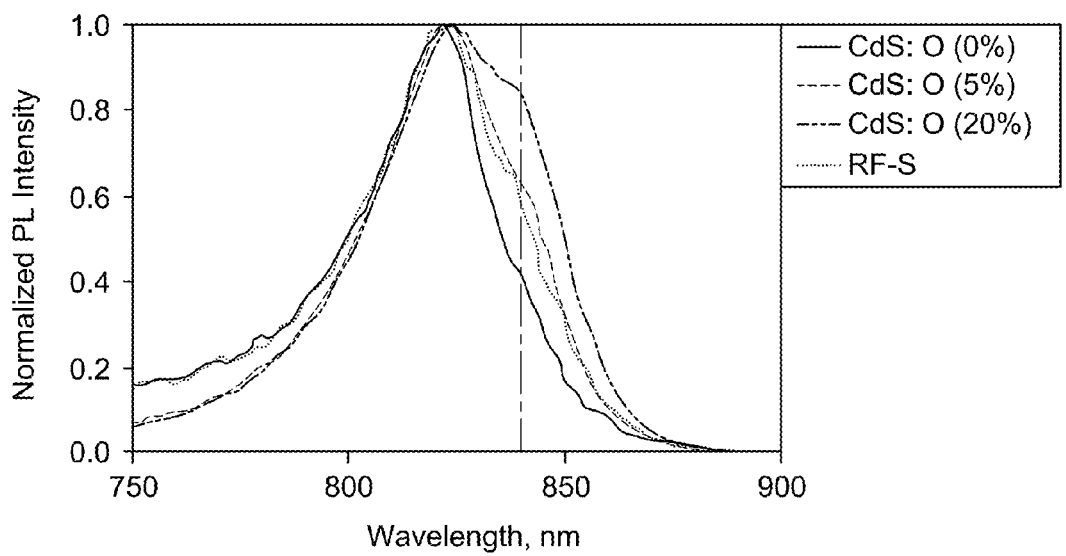
FIG. 8 is a plot of normalized photoluminescence (PL) intensity values as a function of film depth with varying $O_2$ concentration.

Films of CdS with varying oxygen content were deposited using the following method. Radio-frequency sputtering was used to deposit a CdS film on a substrate to form a Comparative Sample (RF-S). Three different samples having varying oxygen content were also prepared by depositing CdS film using DC-sputtering: 0% O (no oxygen), 5% O (5 molar % oxygen in the CdS layer), and 20% O (20 molar % oxygen in the CdS layer). The amount of sulfur-diffusion from the CdS layer into the CdTe layer as a function of oxygen concentration was determined using Time-of-Flight Secondary Mass Ion Spectrometry (TOF-SIMS) and Photoluminescence (PL) measurement. FIGS. 7 and 8 illustrate that the presence of oxygen in the CdS film enhances sulfur diffusion into CdTe when compared to the comparative sample (RF-S) or the sample substantially free of oxygen (0% O).

Example 2

Varying Sulfur-Diffusivity by Post-Deposition Treatment

Thin films of CdS were subjected to post-deposition $CdCl_2$ treatment using the following method. A thin layer of $CdCl_2$ solution (at a concentration of 100 g/l) was coated on top of the CdS films followed by thermal annealing at 400° C. and for a duration of 40 mins. The $CdCl_2$ treated sample was compared with the sample that was not subjected to the $CdCl_2$ treatment.

Figure 9:
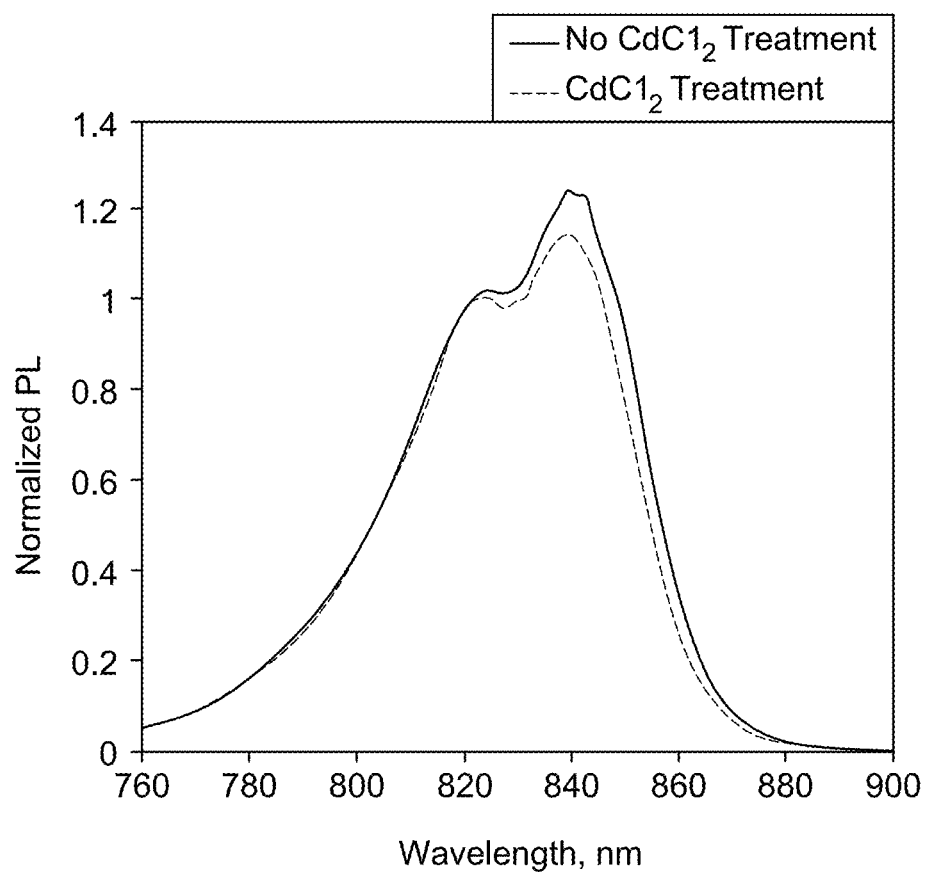
FIG. 9 is a plot of normalized PL intensity values for cadmium chloride ($CdCl_2$)-treated CdS film versus the CdS film not subjected to $CdCl_2$ treatment.

The effect of $CdCl_2$ treatment on the amount of sulfur-diffusion into the CdTe layer was determined using photoluminescence (PL) measurement. FIG. 9 shows that the sulfur diffusion in the CdS film subjected to the post-deposition $CdCl_2$ treatment is lower than of the CdS film not subjected to the $CdCl_2$ treatment.

Example 3

Effect of $CdCl_2$ Post-Treatment and $O_2$ Content on CdS Microstructure

Figure 10:
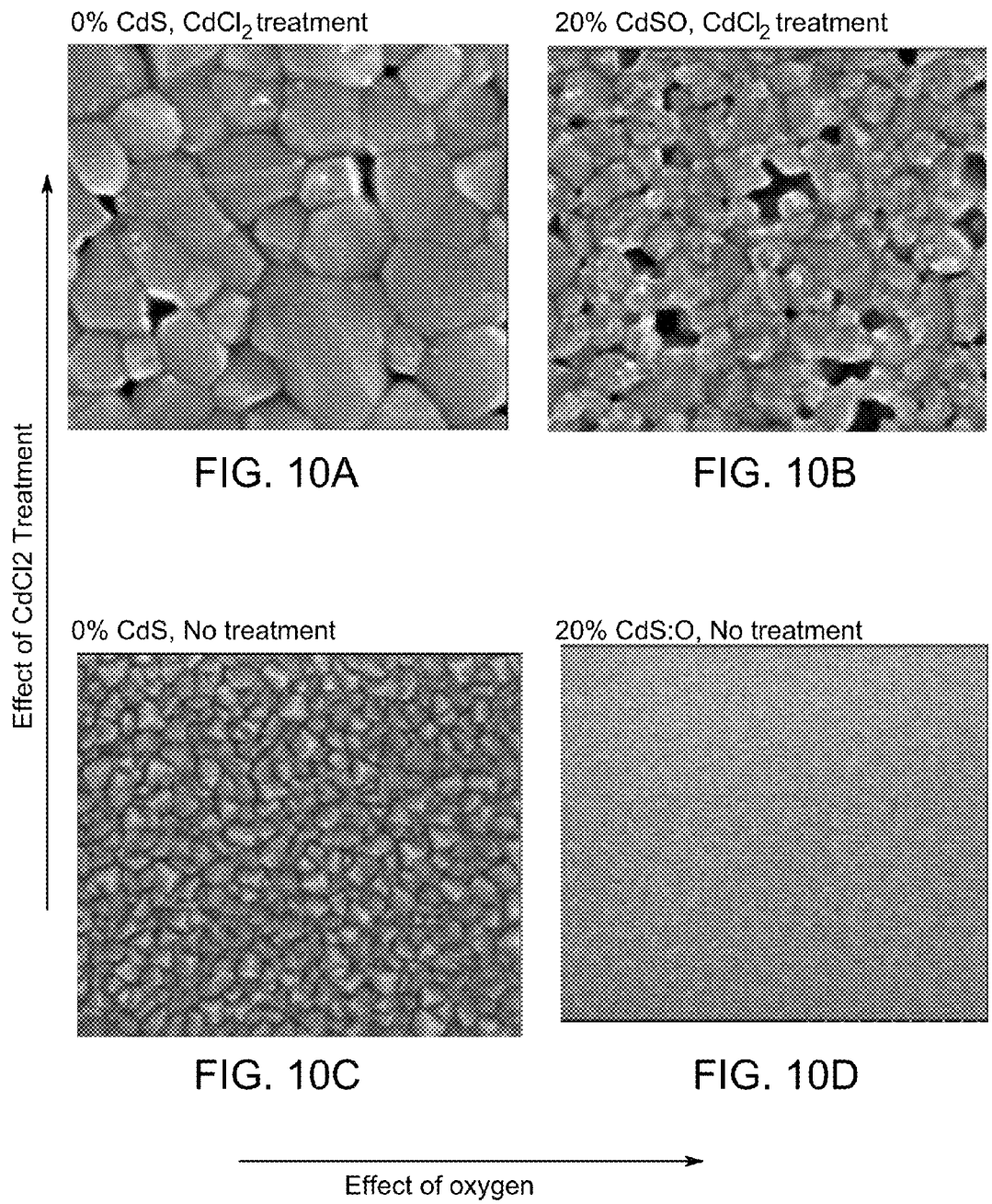
FIG. 10 shows the effect of cadmium chloride ($CdCl_2$) treatment and $O_2$ content on CdS microstructure.

FIG. 10 illustrates the effect of $CdCl_2$ post-treatment and $O_2$ content on CdS microstructure. As illustrated in FIGS. 10A and 10B, the grain size in the CdS layer increased after $CdCl_2$ treatment. Further, as illustrated in FIGS. 10C and 10D, the grain size in the CdS layer decreased as the oxygen content increased.

Example 4

Cadmium Telluride Photovoltaic Devices Having a Window Layer Including a Bi-Layer Structure A cadmium telluride photovoltaic device was made by depositing a CdS on a cadmium tin oxide (CTO) transparent conductive oxide (TCO)-coated substrate. The substrate was a 3 millimeters thick CIPV065 glass, which was coated with a CTO transparent conductive layer and a thin high resistance transparent zinc tin oxide (ZTO) buffer layer. The cadmium sulfide layer was deposited on the TCO layer using the following conditions to form four different samples: single-layer (80 nm low-diffusivity layer); bi-layer 1 (20 nm low-diffusivity layer+60 nm high-diffusivity layer); bi-layer 2 (40 nm low-diffusivity layer+40 nm high-diffusivity layer); and bi-layer 3 (60 nm low-diffusivity layer+20 nm high-diffusivity layer). The low-diffusivity layer was deposited in an atmosphere substantially free of $O_2$ and was thermally annealed before depositing the high-diffusivity layer (if present). The high-diffusivity layer was deposited in an $O_2$ atmosphere such that the deposited layer included about 20 molar % $O_2$, and was not subjected to the annealing treatment.

Following, the deposition of the window layer having one of the four mentioned structures; a CdTe layer (~3 micrometers) was deposited over the CdS window layer using a close spaced sublimation process at a temperature of about 550 degrees Celsius. The resulting assembly was treated with cadmium chloride at a temperature of 370 degrees Celsius for about 40 minutes in air. At the end of the stipulated time, the assembly was treated with a copper solution and subjected to annealing at a temperature of 200 degrees Celsius for a duration of 18 minutes. Gold was then deposited on the copper treated layer as the back contact by evaporation process.

Figure 11:
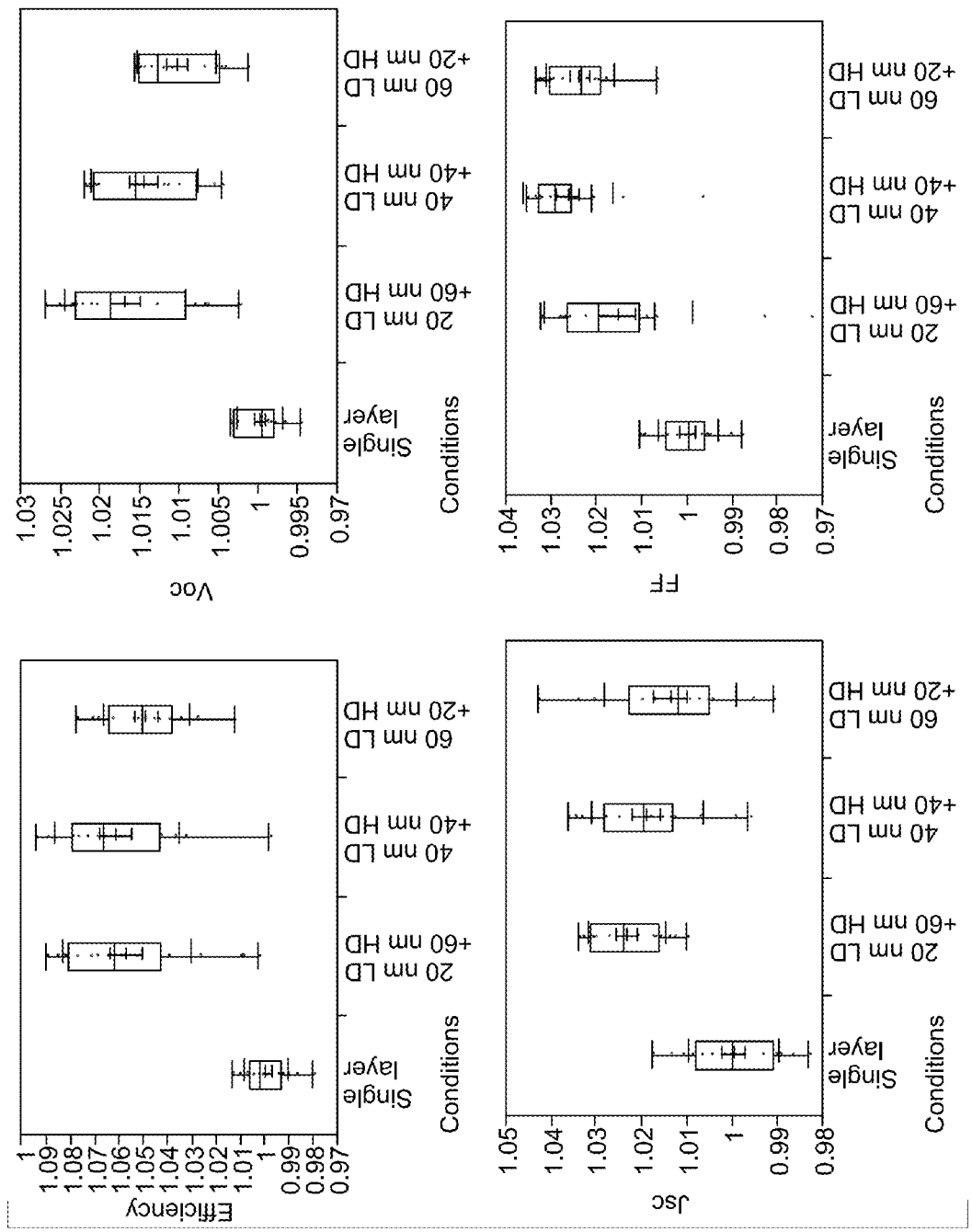
FIG. 11 shows the performance parameters for photovoltaic devices, in accordance with some embodiments of the invention.

As illustrated, in FIG. 11, the device performance parameters showed improvement for the bi-layer (high-diffusivity layer/low-diffusivity layer) structure when compared to the single-layer structure.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

What is claimed is:

1. A photovoltaic device, comprising:
   a transparent conductive layer;
   a window layer disposed on the transparent conductive layer; and an absorber layer disposed on the window layer; wherein the window layer comprises cadmium sulfide, indium sulfide, zinc sulfide, zinc telluride, zinc selenide, cadmium selenide, oxygenated cadmium sulfide, copper oxide, zinc oxihydrate, or combinations thereof;
   wherein the window layer comprises a low-diffusivity layer disposed in direct contact with the transparent conductive layer and a high-diffusivity layer interposed between the low-diffusivity layer and the absorber layer;
   wherein the high-diffusivity layer comprises one or more of a smaller median grain size, greater voids fraction, or lower effective density than the low-diffusivity layer.

2. A photovoltaic device, comprising:
   a transparent conductive layer;
   a window layer disposed on the transparent conductive layer; and an absorber layer disposed on the window layer; wherein the window layer comprises cadmium sulfide, indium sulfide, zinc sulfide, zinc telluride, zinc selenide, cadmium selenide, oxygenated cadmium sulfide, copper oxide, zinc oxihydrate, or combinations thereof;
   wherein the window layer comprises a low-diffusivity layer disposed in direct contact with the transparent conductive layer and a high-diffusivity layer interposed between the low-diffusivity layer and the absorber layer;
   wherein a median grain size in the low-diffusivity layer is greater than a median grain size in the high-diffusivity layer.

3. The photovoltaic device of claim 1, wherein a concentration of oxygen in the high-diffusivity layer is greater than a concentration of oxygen in the low-diffusivity layer.

4. The photovoltaic device of claim 3, wherein the median grain size in the low-diffusivity layer is greater than the median grain size in the high-diffusivity layer.

5. A photovoltaic device, comprising:
   a transparent conductive layer;
   a window layer disposed on the transparent conductive layer; and an absorber layer disposed on the window layer; wherein the window layer comprises cadmium sulfide, indium sulfide, zinc sulfide, zinc telluride, zinc selenide, cadmium selenide, oxygenated cadmium sulfide, copper oxide, zinc oxihydrate, or combinations thereof;
   wherein the window layer comprises a low-diffusivity layer disposed in direct contact with the transparent conductive layer and a high-diffusivity layer interposed between the low-diffusivity layer and the absorber layer;
   wherein a void fraction in the high-diffusivity layer is greater than a void fraction in the low-diffusivity layer.

6. A photovoltaic device, comprising:
   a transparent conductive layer;
   a window layer disposed on the transparent conductive layer; and an absorber layer disposed on the window layer; wherein the window layer comprises cadmium sulfide, indium sulfide, zinc sulfide, zinc telluride, zinc selenide, cadmium selenide, oxygenated cadmium sulfide, copper oxide, zinc oxihydrate, or combinations thereof;
   wherein the window layer comprises a low-diffusivity layer disposed in direct contact with the transparent conductive layer and a high-diffusivity layer interposed between the low-diffusivity layer and the absorber layer;
   wherein an effective density of the low-diffusivity layer is greater than an effective density of the high-diffusivity layer.

7. The photovoltaic device of claim 1, wherein the high-diffusivity layer is disposed adjacent to the low-diffusivity layer and the absorber layer.

8. The photovoltaic device of claim 1, wherein the high-diffusivity layer is disposed adjacent to the absorber layer, and a plurality of layers is interposed between the low-diffusivity layer and the high-diffusivity layer, and
   wherein one or more of oxygen concentration, cadmium sulfate concentration, and void fraction in the plurality of layers increases in a direction away from the low-diffusivity layer and towards the high-diffusivity layer.

9. The photovoltaic device of claim 1, wherein the high-diffusivity layer is disposed adjacent to the absorber layer, and a plurality of layers is interposed between the low-diffusivity layer and the high-diffusivity layer, and
   wherein one or both of median grain size and effective density in the plurality of layers decreases in a direction away from the low-diffusivity layer and towards the high-diffusivity layer.

10. The photovoltaic device of claim 1, wherein the window layer further comprises a second low-diffusivity layer interposed between the absorber layer and the high-diffusivity layer.

11. The photovoltaic device of claim 2, wherein the median grain size in the low-diffusivity layer is in a range from about 20 nanometers to about 200 nanometers.

12. The photovoltaic device of claim 2, wherein the median grain size in the high-diffusivity layer is in a range less than about 20 nanometers.

13. The photovoltaic device of claim 3, wherein the concentration of oxygen in the high-diffusivity layer is in a range from about 4 molar percent to about 25 molar percent.

14. The photovoltaic device of claim 3, wherein the concentration of oxygen in the low-diffusivity layer is in a range up to about 4 molar percent.

15. The photovoltaic device of claim 3, wherein the low-diffusivity layer is substantially free of oxygen.

16. The photovoltaic device of claim 1, wherein the absorber layer comprises cadmium telluride, cadmium zinc telluride, cadmium sulfur telluride, cadmium manganese telluride, cadmium magnesium telluride, copper indium sulfide, copper indium gallium selenide, copper indium gallium sulfide, or combinations thereof.

17. The photovoltaic device of claim 1, wherein the low-diffusivity layer and the high-diffusivity layer comprise substantially the same semiconductor material.

18. The photovoltaic device of claim 1, wherein the low-diffusivity layer and the high-diffusivity layer substantially comprise cadmium sulfide.

19. A photovoltaic device, comprising:
a transparent conductive layer disposed on a support;
a window layer disposed on the transparent conductive layer; and
an absorber layer disposed on the window layer; wherein the window layer comprises cadmium sulfide, indium sulfide, zinc sulfide, zinc telluride, zinc selenide, cadmium selenide, oxygenated cadmium sulfide, copper oxide, zinc oxihydrate, or combinations thereof;
wherein the window layer comprises a first high-diffusivity layer disposed in direct contact with the transparent conductive layer, a second high-diffusivity layer disposed in direct contact with the absorber layer, and a low-diffusivity layer interposed between the first and second high-diffusivity layers;
wherein the high-diffusivity layers comprise one or more of a smaller median grain size, greater void fraction, or lower effective density than the low-diffusivity layer.

20. A The photovoltaic device of claim 1, wherein:
the window layer includes at least one sulfur-containing compound; and
the absorber layer includes at least one tellurium-containing compound.

* * * * *